United States Patent [19]

Yun-Ho

[11] Patent Number: 4,897,559

[45] Date of Patent: Jan. 30, 1990

[54] VARIABLE CLOCK DELAY CIRCUIT UTILIZING THE R-C TIME CONSTANT

[75] Inventor: Choi Yun-Ho, Inchon, Rep. of Korea

[73] Assignee: Samsung Electronics Co., Ltd., Suwon, Rep. of Korea

[21] Appl. No.: 169,491

[22] Filed: Mar. 17, 1988

[30] Foreign Application Priority Data

Mar. 18, 1987 [KR] Rep. of Korea ............... 1987-2458

[51] Int. Cl.[4] ............... H03K 5/13; H03K 17/28; H03K 19/096
[52] U.S. Cl. ............... 307/269; 307/603; 307/605; 307/482; 307/481; 307/578; 365/203
[58] Field of Search ............... 307/269, 601, 602, 603, 307/605, 608, 578, 482, 481, 453, 443, 268; 365/203

[56] References Cited

U.S. PATENT DOCUMENTS

| | | | |
|---|---|---|---|
| 3,349,255 | 4/1965 | McAvoy | 307/604 |
| 3,590,280 | 6/1971 | Hudson et al. | 307/269 X |
| 3,898,479 | 8/1975 | Proebsting | 307/269 X |
| 4,061,933 | 12/1977 | Schroeder et al. | 307/269 |
| 4,554,464 | 11/1985 | Davies et al. | 307/268 |
| 4,611,136 | 9/1986 | Fujie | 307/603 |
| 4,723,299 | 2/1988 | Kobayashi | 307/601 |
| 4,751,407 | 6/1988 | Powell | 307/269 X |
| 4,760,281 | 7/1988 | Takemae | 307/269 |
| 4,788,462 | 11/1988 | Vesce et al. | 307/601 |

*Primary Examiner*—Stanley D. Miller
*Assistant Examiner*—Huy K. Mai
*Attorney, Agent, or Firm*—Fleit, Jacobson, Cohn, Price, Holman & Stern

[57] ABSTRACT

A variable clock delay circuit utilizing the RC time constant in a semiconductor memory has the improved delay effect of the RC time constant. The variable clock delay circuit in which, in the delay occurring between the clocks having the large width of variation according to the variation of the power source voltage, the RC time constant node is separated and precharged so that the delay of the charging time can be prevented, and the residual delay can be removed by using the precharging system utilizing the boosted clock.

22 Claims, 2 Drawing Sheets (CONVENTIONAL CLOCK GENERATOR)

VARIABLE CLOCK DELAY CIRCUIT UTILIZING THE R-C TIME CONSTANT

BACKGROUND OF THE INVENTION

The present invention relates to a variable clock delay circuit utilizing the resistance-capacitance time constant (resistance capacitance: R.C.).

Generally, semiconductor memory devices require times different delay times between various operating clock signals according to their use. Therefore, in order to perform such functions, various clock generators are packaged in semiconductor memory devices according to their use. However, clock generators generate the clocks with predetermined timing according to the use thereof, on the basis of the periods of generators providing the clock signals. Thus, in order to make the desired predetermined timing variable, a delay circuit is used.

FIG. 1 shows a conventional clock delay circuit in which a first clock generator 100 is connected through a variable resistor 111 to a node 113, said node 113 is connected with a capacitor 112 to be grounded, and to an output terminal connecting said resistor 111 in parallel with said capacitor 112 is connected a second clock generator 200, thereby generating the desired clock signal.

FIG. 2A is a circuit showing in detail the required one part of the first and second clock generators 100 and 200, and FIG. 2B is a timing chart for explaining the operation of the circuit shown in FIG. 2A in which 2a shows an input signal waveform occurring at a precharge clock terminal 202, 2b shows one example of input waveform occurring at the signal input terminal 201, and 2c shows one example of an output waveform occurring at the signal output terminal 203.

The operation of the conventional clock delay circuit described above will be explained with reference to FIGS. 1 and 2.

In FIG. 1, when the output of the first clock generator 100, i.e., the node 101, goes to the "high" level, the capacitor 112 is charged up through the variable resistor 111 and the signal of the "high" level is applied through the node 113 to the input terminal of the second clock generator 200 so that said second clock generator 200 may be driven, thereby generating a variable clock regulated in dependence upon the predetermined delay by the drive of said second clock generator 200.

Now, the conventional operation of the example of FIG. 2A will be described in detail.

When a nMOS transistor 3 is turned ON by the "high" level 221 of the precharge clock signal of waveform 2a shown in FIG. 2B, the voltage at a node 15 becomes O[V]. Therefore, the voltage applied to a node 14 by the nMOS transistor 4 is charged by the power source voltage Vcc minus the threshold voltage Vt of the nMOS transistor 2, (Vcc−Vt). At this time, when the input voltage signal 2b at the input voltage terminal 201 goes to the "high" level 222, the voltage applied to the node 15 becomes the input voltage Vin minus the threshold voltage Vt of the nMOS transistor 3, (Vin−Vt). Then if the value of Vin−Vt is greater than the value of Vt (Vin−Vt>Vt), the nMOS transistor 2 is turned ON. Therefore, node 14 is discharged to O[V], and the nMOS transistors 10 and 12 are turned OFF. Accordingly, a "high" signal 223 of waveform 2c shown in FIG. 2B occurs at the output terminal 203. That is to say, if the input voltage Vin at terminal 201 exceeds 2Vt (Vin>Vt+Vt), then at the output terminal 203 the signal shown as waveform 2c occurs.

When said output is varied by the power source voltage at the node 101 in FIG. 1, the voltage at the node 113 varies by 63% of the power source voltage Vcc after the predetermined time constant [τ=R(111) C(112)] depending on the values of the variable resistor (111) and the capacitor (112). Due to this, there has been produced a problem of impractical use in which, when the input voltage Vin exceeds 2 Vt, the signal occurring at the output terminal 203 does not obtain the desired effect of the predetermined RC time constant. That is, when the power source voltage is 5V and the threshold voltage Vt is 0.8V, the input voltage of the second clock generator 200 after one RC time constant is 3.16V (5V·0.63).

However, since, before that, i.e. when Vin=2Vt=1.6V, the output at the output terminal 203 is produced from the second clock generator 200, the effect of the time constant is accomplished only to the half extent. If the power source voltage Vcc is 3V, the input voltage Vin after one RC time constant is 1.98V (3V×0.63) at the node 101. Accordingly, since, when Vin=2Vt=1.6V, a clock is produced from the second clock generator 200, the regulated delay between the clocks is obtained to the extent approximately equal to the time constant.

As described above, in the conventional clock delay circuit, the variation in width of the delay between the clocks according to the variation of the power source voltage Vcc is large. That is, a small amount of delay is obtained at the "high" of power source voltage Vcc and a large amount of delay is obtained at the "low" of power source voltage Vcc. Therefore, the stabilization of operation is not accomplished.

SUMMARY OF THE INVENTION

Accordingly, an object of the present invention is to provide a variable clock delay circuit which determines the delay values dependent on purely the value of RC and improves the defect that the absolute values of the delay are varied according to the differences of the power source voltage levels.

Another object of the present invention is to provide a variable clock delay circuit in which an impulse in the power source voltage caused by an external factor of the system, can remove a residual delay by using a precharging system utilizing a boosted clock.

According to the present invention, the aforementioned objects are obtained by providing a variable clock delay circuit utilizing the RC time constant which is provided with the first and second clock generators, and which is constituted in such a manner that although the power source voltage is varied during the precharging period of an RC time constant by gating of the boosted precharge clock, a delay resulting from the bump-down and the input delay of the precharge clock is prevented, and a transistor having a large size is gated by the predetermined output signal of the R.C time constant by the gating signal of said first clock generator and said second clock generator is driven by said gating signal, thereby obtaining the desired variable delay clock signal.

BRIEF DESCRIPTION OF THE DRAWINGS

The invention may be better understood, and further advantages and use thereof more readily apparent, when considered in view of the following detailed description of an exemplary embodiment, taken with the accompanying drawings, in which.

DETAILED DESCRIPTION OF THE PREFERRED EMBODIMENTS

Now, a variable clock delay circuit according to the present invention will be described hereinafter with reference to FIGS. 3 and 4.

Figure 1:
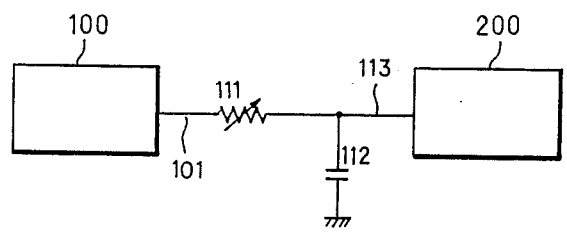
FIG. 1 is a diagram showing, partly in block form, a conventional clock delay circuit.
Figure 2A:
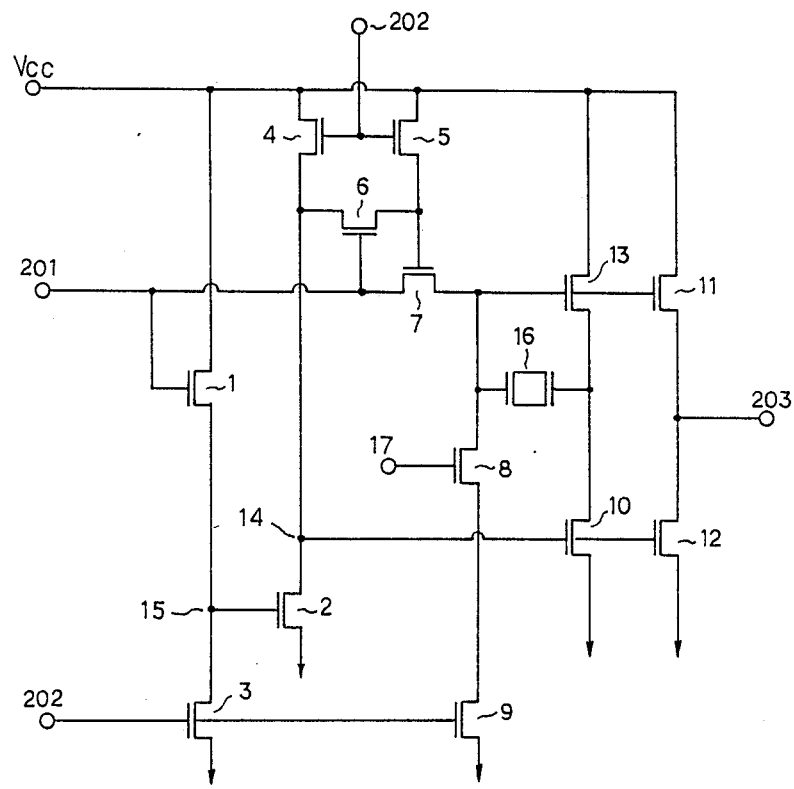
FIG. 2A is a circuit showing in detail the required one part of first and second clock generators.
Figure 2B:
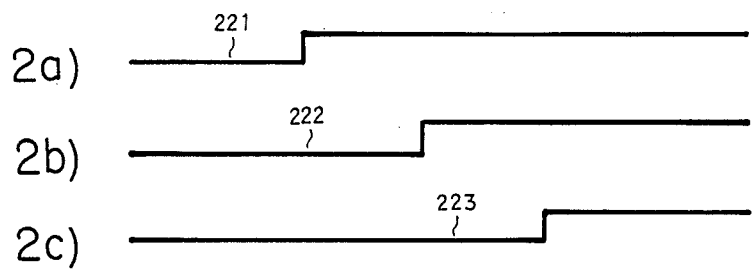
FIG. 2B is a timing chart for explaining the operation of the circuit shown in FIG. 2A.
Figure 3:
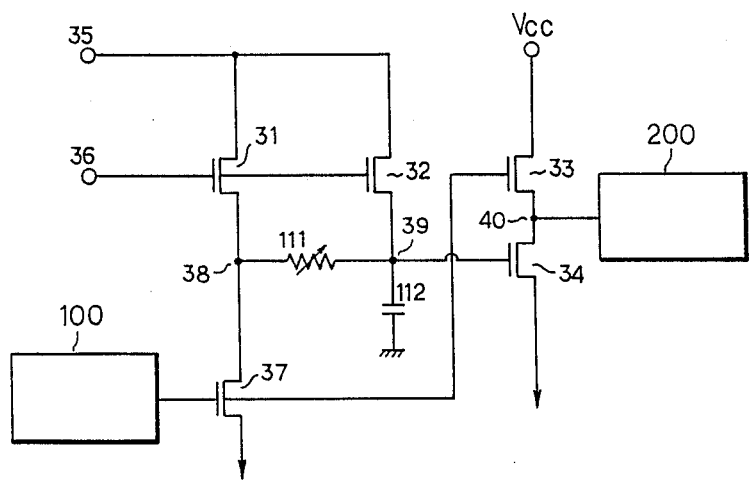
FIG. 3 is a diagram showing, partly in block form, a variable clock delay circuit according to an embodiment of the present invention.

FIG. 3 generally shows, partly in block form, a variable clock delay circuit according to the present invention. In FIG. 3, the reference numerals 31 to 34 represent the nMOS transistors, respectively, 111 a resistor, 112 a capacitor, 35 a precharge clock terminal, 36 a boosted precharge clock terminal, and 100 and 200 a first and a second clock generators respectively equal to the first and second clock generators 100 and 200 shown in FIG. 1.

Precharge clock terminal 35 is connected to each of the drain terminals of nMOS transistors 31 and 32, boosted precharge clock terminal 36 is connected to each of the gate terminals of nMOS transistors 31 and 32, and the output terminal of first clock generator 100 is connected to each of the gate terminals of the nMOS transistors 37 and 33, respectively.

To a node 38 formed between the source terminal of nMOS transistor 31 and the drain terminal of nMOS transistor 37 is connected the variable resistor 111, and in parallel to variable resistor 111 is connected the capacitor 112 to be grounded. Also, to a node 39 formed between the output side of variable resistor 111 and capacitor 112 is connected the source terminal of the nMOS transistor 32, and to node 39 is connected the gate terminal of the nMOS transistor 34 and the source terminal thereof is grounded.

Moreover, the input terminal of the second clock generator 200 is connected to the node 40 formed between the source terminal of the nMOS transistor 33 and the drain terminal of the nMOS transistor 34.

Figure 4:
FIG. 4 is a timing chart for explaining the operation of the circuit according to the present invention shown in FIG. 3.
Figure 4:
Figure 4:
Figure 4:

FIG. 4 shows, by way of example, timing charts of the clock signals for explaining the operation of the circuit according to the present invention shown in FIG. 3. In FIG. 4, waveform 4a shows the input waveform occurring at the precharge clock terminal 35 in FIG. 3, waveform 4b shows the boosted precharge clock signal waveform, where the amplitude of the waveform 4b is to be about 5V, and waveform 4c shows the output signal waveform of the delay signal produced by the first clock generator 100, while waveform 4d shows an output signal at node 40 resulting from waveform 4c, which is applied to the second clock generator 200 after receiving the output from the first clock generator 100 (i.e., waveform 4d is obtained by delaying wave form 4c by a RC time constant).

Accordingly, the embodiment of the present invention will be explained in detail with reference to FIG. 3 and 4.

During the precharge time period, the precharge clock signal 4a is applied so that the nodes 38 and 39 through the nMOS transistors 31 and 32 which are gated by the boosted precharge clock signal 4b, may be precharged, and at active time the output of the first clock generator 100 makes the nMOS transistors 37 and 33 turn ON. At this time, since the nMOS transistor 34 has a larger size than the nMOS transistor 33, the input signal at the node 40, i.e., the input signal of the second clock generator 200, does not go to a "high" level until node 39 is discharged below the threshold voltage Vt.

However, if the voltage at the node 39 is discharged below the threshold voltage Vt, the nMOS transistor 34 is turned OFF to allow the node 40 to be "high" level so that the second clock generator 200 is driven, thereby producing the desired variable clock according to a predetermined delay.

Accordingly, the node 39, when discharging through the variable 111 and the nMOS transistor 37, enlarged the size of the nMOS transistor 37 so as to raise the conductance, and the time constant is dependent on the variable.

The foregoing paragraphs describe a circuit for delaying a variable clock by utilizing the RC time constant which is provided with a variable resistor 111 and a capacitor 112, between a first clock generator 100 and second clock generator 200.

The circuit includes a first stage for preventing delay of a clock signal caused by bump-down and the delay of an input signal at the precharge clock terminal 35 due to change of source voltage during the precharging period, by the expedient of using as a gating signal a boosted precharge signal applied to clock terminal 36 and the use of variable resistor 111 and capacitor 112 to set the time constant.

The second stage gates the high output transistor with the output of the time constant circuit (formed by variable resistor 111 and capacitor 112), thereby attaining a desired variable clock applied to the second clock generator 200 by delaying and regulating by a predetermined amount the clock signal generated by first clock generator 100.

The first stage is constructed with variable resistor 111 connected to node 38 and to the source side of nMOS transistor 31 and at node 39, is connected to capacitor 112 and to the source side of nMOS transistor 32 so that nodes 38, 39 are separated and precharged, and the output of the boosted precharged clock terminal 36 gates nMOS transistors 31, 32, thereby preventing delay caused by change of the source voltage through bump-down during precharging via the precharge input clock terminal 35.

The second stage is constructed with the power source having voltage Vcc connected to the drain side of nMOS transistor 33, with node 38 and variable resistor 111 connected to drain side of nMOS transistor 37 which has a larger size than nMOS transistor 33 in order to raise the conductance upon discharging, and with the connecting node 39 and capacitor 112 connected to the gate of nMOS transistor 34 having a larger size than nMOS transistor 33, so that clock generator 200 is connected to the drain of nMOS transistor 200 and is driven by using the output from clock generator 100 to gate nMOS transistor 37 and 33.

In the aforementioned operation, the reason why the nodes 38 and 39 are separated and precharged is to prevent the precharging time by the variable resistor 111 from being delayed. Also, the reason of gating the boosted precharge clock signal 4b to precharge the nodes 38 and 39 is that since the precharge clock signal 4a is connected to the nodes 38 and 39 without any voltage drop, when the power source Vcc is changed during the precharging time the variation of the voltage at the nodes 38 and 39 follows the changed precharge clock signal 4a according to aforementioned change, that is to say this is the bump-down of the negative power source voltage Vcc. Accordingly, the aforementioned second reason of precharging is to prevent the residual delay from occuring by the closed source voltage in change caused between the nodes 38 and 39 by the external factors of the system.

The prevention of delay by said bump-down is included in the present invention as another point together with the conception of the RC discharge. It can be understood that the delay between the clocks obtained by the present invention is the time of changing the voltage from the precharge voltage Vcc to the threshold voltage Vt of making the nMOS transistor 34 turned-OFF at the node 39. Accordingly, the delay width irrelevant to the change of the absolute value of the power source voltage Vcc can be obtained.

As described above, the present invention has the advantages that the change of the absolute value of delay can be removed according to the difference in the change level of the power source voltage by determining the delay dependent on purely RC value, and that, by the precharge system utilizing the boosted clock, the residual delay which is capable of producing in the bump of the power source voltage is removed, thereby regulating freely the variable clocks.

Although a certain preferred embodiment has been shown and described, it should be understood that many changes and modifications may be made therein without departing from the scope of attached claims.

What is claimed is:

1. A circuit for delaying a clock signal between a first clock generator and a second clock generator, comprising:

first means including a charging impedance stage, for controlling delay of a precharge clock signal to said charging impedance stage during a precharging period due to change in amplitude of a voltage; and second means for gating a first clock signal output by a first clock generator to a second clock generator in reference to discharging of said charging impedance stage, thereby providing an output clock signal whereby change in delay of application of said first clock signal to said second clock generator due to change in amplitude of the voltage source is minimized.

2. A clock delay circuit, comprising:

first means providing first and second nodes respectively operably connected to both sides of a resistance in a resistance-capacitance stage, for responding to a first precharge signal by applying a second precharge signal to both said first and second nodes and thereby charging a capacitance of said resistance-capacitance stage coupled to said second node;

second means connected to said first and second nodes and providing a third node, for responding to a first clock signal by enabling discharge of the capacitor via the resistance, and for responding to said first clock signal by applying a first potential to said third node, upon partial discharge of the capacitance to a threshold voltage.

3. The circuit of claim 2, wherein said first means comprises first and second transistors having control electrodes coupled to receive said first precharge signal and conduction electrodes coupled to separately apply said second precharge signal to said first and second nodes.

4. The circuit of claim 3, wherein said second means is comprised of:

third and fourth transistors having electrodes coupled to receive said first clock signal, said third transistor having conduction electrodes coupled to discharge the capacitance in response to said first clock signal; and a fifth transistor exhibiting a threshold voltage, having a control electrode coupled to respond to the charge of the capacitance, and having conduction electrodes coupled with conduction electrodes of said fourth transistor to apply said first potential to said third node.

5. The circuit of claim 2, wherein said second means is comprised of:

first and second transistors having electrodes coupled to receive said first clock signal, said first transistor having conduction electrodes coupled to discharge the capacitance in response to said first clock signal; and a third transistor exhibiting a threshold voltage, having a control electrode coupled to respond to the charge of the capacitance, and having conduction electrodes coupled with conduction electrodes of said second transistor to apply said first potential to said third node.

6. The circuit of claim 5, further comprising said first transistor having a larger size than said second transistor to thereby provide increased transconductance during said discharge of the capacitance.

7. The circuit of claim 5, further comprising said third transistor having a larger size than said second transistor.

8. The circuit of claim 2, wherein said second means is comprised of third and fourth transistors having electrodes coupled to receive said first clock signal, said third transistor having conduction electrodes coupled to discharge the capacitance in response to said first clock signal; and a fifth transistor exhibiting a threshold voltage, having a control electrode coupled to respond to the charge of the capacitance, and having conduction electrodes coupled with conduction electrodes of said fourth transistor to apply said first potential to said third node.

9. The circuit of claim 8, further comprising said third transistor having a larger size than said fourth transistor to thereby provide increased conductance during said discharge of the capacitance.

10. The circuit of claim 9, further comprising said fifth transistor having a larger size than said fourth transistor.

11. The circuit of claim 8, further comprising said fifth transistor having a larger size than said fourth transistor.

12. In an integrated circuit, a delay circuit comprising:

first and second transistors having conduction electrodes serially coupled together between a precharge terminal and a reference terminal, with conduction electrodes connecting the first and second transistors forming a first node;

a third transistor having conduction electrodes coupled between the precharge terminal and a second node;

control electrodes of said first and third transistors being connectable to receive an advanced precharge signal;

fourth and fifth transistors having conduction electrodes serially coupled together between a source voltage terminal and the reference terminal, with conduction electrodes connecting the fourth and fifth transistors forming a third node;

control electrodes of said second and fourth transistors being operably connected to receive an input clock signal, and a control electrode of said fifth transistor being coupled to said second node; and means coupled to said second node, for storing a charge upon application of a potential to said precharge terminal and for discharging said charge via said second node upon application of a precharge clock signal to a control electrode of said second transistor.

13. The circuit of claim 12, further comprising a resistance coupled between said first and second nodes, whereby after application of an input clock signal to said control electrodes of said second and fourth transistors, occurrence of an output clock signal at said third node is delayed in dependence upon the value of said resistance.

14. The circuit of claim 12, further comprising said fifth transistor having a larger size than said fourth transistor, whereby said fifth transistor is turned to an OFF state when voltage at second node falls below a threshold voltage of said fifth transistor.

15. The circuit of claim 14, further comprising said second transistor providing a greater conductance than said fourth transistor.

16. The circuit of claim 12, wherein said fifth transistor has a larger conductance than said fourth transistor.

17. The circuit of claim 12, further comprising said second transistor providing a greater conductance than said fourth transistor.

18. A clock delay circuit, comprising:

first and second transistors having drain terminals coupled to receive a first precharge signal, and control electrodes coupled to receive a second precharge signal;

a third transistor having a drain electrode coupled to form a first node with a source electrode of said first transistor;

a fourth transistor having a drain electrode coupled to a source voltage terminal, and a control electrode coupled with a control electrode of said third transistor to receive a first clock signal;

a fifth transistor having a control electrode coupled to form a second node with a source electrode of said second transistor, and a drain electrode coupled to a source electrode of said fourth transistor to form a third node with said fourth transistor;

a capacitance coupled to said second node; and means coupled to said first and second nodes, for delaying discharge via said second node of a charge held by said capacitance.

19. The circuit of claim 18, wherein said fifth transistor has a larger size than said fourth transistor, whereby said fifth transistor is turned to an OFF State when voltage at said second node falls below a threshold voltage of said fifth transistor.

20. The circuit of claim 18, wherein said fifth transistor has a larger conductance than said fourth transistor.

21. The circuit of claim 18, wherein said third transistor has a greater conductance than said fourth transistor.

22. A circuit for delaying a clock signal between a first clock generator and a second clock generator, comprising:

first means providing first and second nodes, means for storing a charge and means disposed between said first and second nodes for limiting dissipation of said charge, for gating application of a precharge clock signal to said first and second nodes to enable storage of said charge by said storing means during a precharging period; and second means for partially dissipating said charge and controlling application of a first clock signal output by a first clock generator to a second clock generator in response to the amplitude of said charge, thereby providing an output clock signal.

* * * * *